US006181556B1

(12) United States Patent
Allman

(10) Patent No.: US 6,181,556 B1
(45) Date of Patent: Jan. 30, 2001

(54) THERMALLY-COUPLED HEAT DISSIPATION APPARATUS FOR ELECTRONIC DEVICES

(76) Inventor: Richard K. Allman, 1026 59th St. N., St. Petersburg, FL (US) 33703

( * ) Notice: Under 35 U.S.C. 154(b), the term of this patent shall be extended for 0 days.

(21) Appl. No.: 09/367,788

(22) PCT Filed: Jul. 21, 1999

(86) PCT No.: PCT/US99/16503

§ 371 Date: Aug. 20, 1999

§ 102(e) Date: Aug. 20, 1999

(51) Int. Cl.$^7$ .................................................. H05K 7/20
(52) U.S. Cl. .................. 361/690; 361/694; 361/695; 361/697; 361/704; 361/719; 361/720; 174/16.3; 174/16.1; 165/80.3; 165/185; 257/718; 257/727; 257/719
(58) Field of Search ........................... 361/688–690, 361/694, 695, 697, 703, 704, 707, 717–720, 818; 257/718, 719, 727; 174/15.1, 16.1, 16.3; 165/80.3, 104.33, 185

(56) References Cited

U.S. PATENT DOCUMENTS

| | | |
|---|---|---|
| 2,412,989 | 12/1946 | Kotterman . |
| 3,317,798 | 5/1967 | Chu et al. . |
| 3,749,981 | 7/1973 | Koltuniak et al. . |
| 4,449,579 | 5/1984 | Miyazaki et al. . |
| 4,557,225 * | 12/1985 | Sagues et al. ................... 123/41.31 |
| 5,054,545 | 10/1991 | Ghaemian . |
| 5,184,281 * | 2/1993 | Samarov et al. ................... 361/704 |
| 5,309,983 | 5/1994 | Bailey . |
| 5,353,863 | 10/1994 | Yu . |
| 5,457,342 | 10/1995 | Herbst, II . |
| 5,603,374 | 2/1997 | Wu . |
| 5,615,084 | 3/1997 | Anderson et al. . |
| 5,706,169 | 1/1998 | Yeh . |
| 5,735,340 | 4/1998 | Mira et al. . |
| 5,771,153 | 6/1998 | Sheng . |
| 5,785,116 | 7/1998 | Wagner . |
| 5,794,685 | 8/1998 | Dean . |
| 5,815,371 * | 9/1998 | Jeffries et al. ..................... 361/704 |
| 5,816,319 | 10/1998 | Kamekawa et al. . |
| 5,818,694 | 10/1998 | Daikoku et al. . |
| 5,835,347 | 11/1998 | Chu . |
| 5,838,065 | 11/1998 | Hamburgen et al. . |
| 5,864,465 | 1/1999 | Liu . |
| 5,873,406 | 2/1999 | Horng . |
| 5,936,836 * | 8/1999 | Scholder ............................. 361/695 |
| 5,945,736 * | 8/1999 | Rife et al. ........................... 257/719 |
| 5,999,405 * | 12/1999 | Zappacosta et al. ............... 361/704 |
| 6,101,091 * | 8/2000 | Baik .................................... 361/704 |

\* cited by examiner

Primary Examiner—Leo P. Picard
Assistant Examiner—Boris L. Chervinsky
(74) Attorney, Agent, or Firm—Larson & Larson, P.A.; James E. Larson

(57) ABSTRACT

A thermally-coupled heat-dissipation apparatus (10) surrounds a solid state electronic device mounted on an adapter circuit board (14) or a thermal transfer column (74) extending upwardly from a main board socketed device. The apparatus (10) includes at least two heat sinks (18 and 20) positioned in a spaced parallel relationship on front and back sides (22 and 28) of the adapter circuit board (14) or thermal transfer column (74). A bridge member (38) thermally couples the two heat sinks (18 and 20). A plurality of fans (42) are mounted along outer surfaces of the heat sinks (18 and 20). In a preferred embodiment, the bridge member (38) is an additional heat sink, but could be a metal plate in alternate embodiments. The preferred device to cool using the present invention is a computer processor (12).

26 Claims, 8 Drawing Sheets

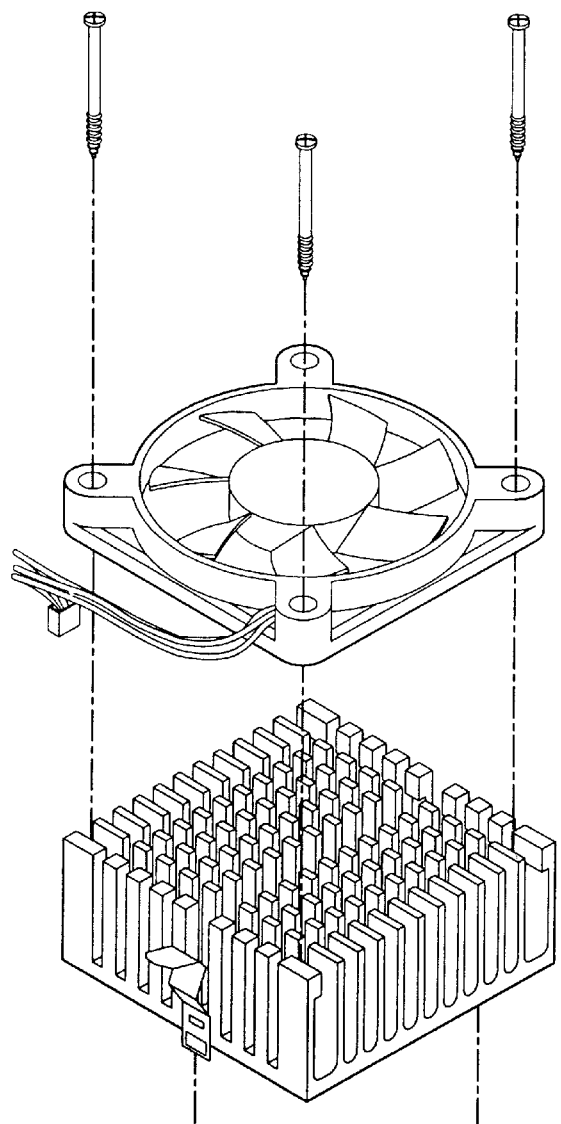
FIG. 1
PRIOR ART
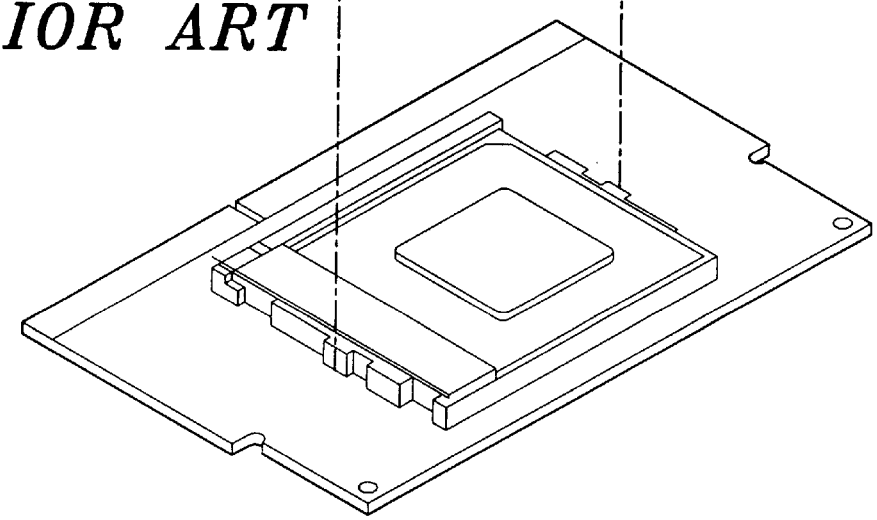

THERMALLY-COUPLED HEAT DISSIPATION APPARATUS FOR ELECTRONIC DEVICES

PRIOR APPLICATIONS

This application is a §371 U.S. National Phase application which bases priority on International Application No. PCT/US99/16503, filed Jul. 21, 1999.

TECHNICAL FIELD

This invention relates to heat dissipators for electronic devices. More particularly, it relates to a thermally-coupled heat dissipation apparatus for use with high-heat generating solid state electronic components and devices.

BACKGROUND ART

Heat can have detrimental effects on any solid state electronic device if not properly monitored and controlled. Unfortunately, heat is a natural occurring by-product of any working solid state electronic device. This is due to the intimate relationship between heat and power. As a solid state device draws power and completes its task to which it is designed to accomplish, heat is generated. In some devices, the heat generated, and therefore subjected upon the device, is low in comparison to the total "heat stress" that the device can stand. In other devices however, heat is the enemy.

Nowhere is heat more detrimental in a solid state electronic device than in semiconductors. In particular, the heat generated by a central processing unit (CPU) of a computer, if not properly dissipated, is certain to destroy the CPU. As technical advancements increase the speed of computer CPUs, so causes the need for more power to run the faster CPUs, and hence more heat is generated. Improvements upon heat dissipators for computer CPUs have been developed. But as will be shown, these improvements are falling well short of the need for a superior heat dissipator for fast-speed, high-heat generating computer CPUs.

The heat generated by an older style CPU, such as a 286 or 386 based processor, did not require the use of a heat dissipator. The heat generated by these processors was merely allowed to dissipate through convection cooling—heat transfer by the natural upwardly flow of hot air from the processor. But as CPUs advanced, such as the 486, Pentium and other faster processors, a need for additional cooling was required. Typically, these faster CPUs were equipped with a heat sink mounted on top of the CPU and a fan mounted on top of the heat sink for blowing air through the heat sink fins towards the top of the CPU. Such a cooling device can be seen in U.S. Pat. No. 5,603,374 to We. Unfortunately, this device has many deficiencies. In particular, the device relies on a single heat sink and fan assembly. This type of configuration may be adequate for an older style processor, such as a 486-based processor, but is surely not adequate for dissipating the heat generated by Pentium-based and other faster style processors. Further, the single fan assembly does not provide any redundancy to the heat dissipation system. If the single fan fails, the cooling system will not provide the necessary cooling ability required. The result is thermal run-away of the CPU and its subsequent failure in operation. Still further, the "stacking" of a heat sink and fan on top of a processor tends to cause spacing problems when used with today's processors. This can be attributed to the large heat sinks required for today's processors. The size of the heat sink tends to be proportional to the amount of heat generated by a fast-speed processor. In other words, very fast processors require very large heat sinks. Further, many of today's processors are mounted on a daughter board which in turn plugs into the motherboard at a ninety degree angle (i.e., Slot 1 or Slot A configuration), distinguishing those mounted directly to the motherboard in a parallel relationship (i.e., Socket 7 configuration)—also known as a "socketed" processor. The daughter board mounts (Slot 1 or Slot A) require the conservative use of space, especially when a pair of mounts or slots are provided for dual processing capabilities.

In an effort to limit the size of the heat sink, various improvements were made in order to provide a superior heat sink having a low profile. Such can be seen in U.S. Pat. No. 5,794,685 to Dean. The device shown therein employs a heat sink for mounting directly to the CPU having a generally circular shape. A single fan mounts to the top of the heat sink. This low profile device attempts to provide greater heat dissipation through matching the form of the heat sink to the blade configuration of the fan. Although this cooling system may provide greater cooling effects than that seen in the We device, it still falls short of providing adequate cooling for the faster processors used in today's computers. Further, this system would not work well with a CPU mounted on a daughter board, due to the fact that the circular-shaped heat sink does not provide an adequate means for attaching the heat sink and fan to the CPU. All daughter board mounted cooling assemblies require some form of mounting means which will retain the cooling system to the CPU when the daughter board is plugged into the motherboard at the ninety degree angle. Still further, this system does not provide adequate redundancy, in that only one fan is employed.

Attempts to limit the profile of the cooling system to provide adequate cooling to today's faster CPUs can be seen in U.S. Pat. No. 5,309,983 to Bailey, U.S. Pat. No. 5,615,084 to Anderson et al. and U.S. Pat. No. 5,873,406 to Hong. Each of these cooling systems employs some type of single heat sink and single fan assembly, wherein the fan rests in an alcove formed in the heat sink. Each system addresses the problem of limited spacing inside of a computer, but does not adequately address other problems inherent in the prior art. For instance, none of these devices contemplate the use of more than one fan. Accordingly, redundancy is not provided and the failing of the fan results in inadequate cooling capabilities (thermal run-away of the processor). Further, although spacing is addressed in these devices, the need for additional cooling elements for faster-speed CPUs is not contemplated. Accordingly, these devices may not adequately cool current and future processors.

To address the high heat problem of the faster speed processors, such as Pentium-based processors, certain improvements have been made for attempting to adequately cool these devices. U.S. Pat. No. 5,353,863 to You teaches a Pentium CPU cooling system including a heat sink mounted on top of the CPU and a fan mounted to the side of the heat sink. The invention herein attempts to utilize the fan to blow the heat generated by the CPU, and conducted through the heat sink, out of the computer case. Unfortunately, this device is very "product specific." Nowhere is it taught that the invention can be employed on a daughter board mounted CPU. In fact, this invention requires that the CPU be mounted on the motherboard in a location proximal to the computer housing vents, so that the hot air can be expelled out of the case through the vents. Further, no redundancy is suggested. Accordingly, upon failure of the single fan, the entire cooling system fails.

Other attempts to cool the faster processors can be seen in U.S. Pat. No. 5,771,153 to Sheng and U.S. Pat. No. 5,835, 347 to CCU. Each of these inventions teach a system for cooling fast speed processors which are provided to consumers in plastic cases (i.e., Pentium-II or Pentium-III based processors). Unfortunately, these devices are very product specific. Each teach a cooling system which can be attached to the plastic case of the processor. Both require special clip mechanisms for attaching to the plastic case. Neither prior art reference suggest any form of redundancy and both rely on the single fan, single heat sink assembly.

Other various attempts at improved cooling systems have been attempted. U.S. Pat. No. 5,457,342 to Herbst II teaches a traditional prior art "stacked" cooling system with an additional cooling element—namely, a Peltier Effect cooling module. Peltier Effect cooling modules are electrical "heat pumps" which conduct heat from one side of the module to another through a conductor layer. Accordingly, when working properly, there is one hot and one cold side on any Peltier Effect module. In the prior art, Peltier Effect modules are inserted between the CPU and the heat sink. When working properly, the Peltier Effect module provides additional cooling to the CPU. But, if the Peltier Effect module fails, or if exposed to insufficient airflow due to fan failure, the module acts as an insulator between the CPU and heat sink thereby redirecting the heat back into the processor causing thermal run-away of the processor. Further, with the Peltier Effect module working properly, in scenarios when the processor is not generating a lot of heat, Peltier Effect modules which are mounted directly on the CPU are known to cool the processor below a safe operating range thereby depositing condensation on the processor and potentially damaging the processor.

U.S. Pat. No. 5,706,169 to Yeh discloses another cooling system for CPUs which provides for a single heat sink having two sections. Each section has a plurality of fins defining a plurality of first cooling ducts disposed in parallel relation. The two sections are spaced from one another by a single second cooling duct positioned perpendicular to the plurality of first cooling ducts. A fan is mounted on top of the heat sink. This device provides a cooling system having many of the inherent deficiencies as other prior art systems. It does not provide for redundant fans nor addresses many of the spacing problems seen with daughter board mounted processors.

An attempt at providing additional heat dissipation capabilities for a CPU resulted in the development of a product produced by ComputerNerd. The product utilizes a pair of heat sinks for surrounding a processor mounted on a daughter board. Fans are provided on the heat sink which is placed proximal to the die of the processor (front-side). A second heat sink is merely placed proximal to the back-side of daughter board, where the solder connections of the electrical components are located. Since 90% of all heat generated by a CPU emanates from the die area (front-side) of the processor, the second back-side heat sink provides essentially no additional heat dissipation for the processor, since the back-side heat sink fails to communicate in any manner with the front-side heat sink.

An improved cooling system is needed for computer CPUs and other solid state devices that generate substantial heat. The improved system should address all of the deficiencies seen in the prior art. In particular, an improved system should be provided which adequately dissipates heat from the high heat generating processors used in today's computers. Redundant fan assemblies should be provided to avoid thermal run-away of a processor due to the failure of the single fan. Additional heat sinks, thermally coupled, should also be provided which can assist in the conduction of the heat away from the processor, especially the heat generated on the front-side of a Slot 1 mounted processor. Adequate spacing should be provided for those processors mounted in Slot 1 or Slot A configurations. Such a system should also be non-product specific, working universally with all types of processors. If Peltier Effect modules are to be employed with the improved cooling system, the potential failure of the Peltier Effect module should be addressed for avoiding thermal run-away of the processor. In addition, the possible cooling of the processor to a point where condensation may form on the processor should also be addressed when considering the use of Peltier Effect modules.

DISCLOSURE OF INVENTION

I have invented an improved heat dissipation device for high-heat generating solid state devices. My device can work with a plurality of solid state devices and in its preferred embodiment is used with computer CPUs mounted in Slot 1 or Slot A configurations. My device overcomes all of the deficiencies seen in the prior art and specifically, although not limited to, those discussed hereinabove. Component reliability of the devices to b e cooled and MTBF (mean time between failure) is greatly improved with the device of the p resent invention. The novel device can maintain a component temperature below 40 degrees Celsius when the ambient temperature is at 25 degrees Celsius and while under full operational load, thereby dramatically extending the useful life of the electronic component being cooled.

It is therefore an object of the present invention to provide an improved heat dissipation device which can adequately cool high-speed, high-heat generating computer CPUs and other high-heat generating solid state devices.

It is a further object of the present invention to provide an improved heat dissipation device for computer CPUs which can be used with a plurality of different processors, including, but not limited to, those mounted on a adapter circuit board as well as socketed directly to a main board.

It is still a further object of the present invention to provide an improved heat dissipation device for computer CPUs which permits passive and active cooling elements to be employed while not exceeding the confined spacing requirements of a small business or personal computer.

It is yet still a further object of the present invention to provide an improved heat dissipation device for computer CPUs which allows the use of a multitude of thermally-bridged heat sinks surrounding a single processor.

It is even yet still a further object of the present invention to provide an improved heat dissipation device for computer CPUs which employs a multitude of primary active cooling elements thereby providing a level of redundancy in case of partial failure thereof.

It is even yet still a further object of the present invention to provide an improved heat dissipation device for computer CPUs which employs secondary active cooling elements which even in case of failure will not re-direct heat into the CPU and cause thermal runaway of the processor.

The device of the present invention includes a plurality of thermally-bridged heat sinks. In the preferred embodiment, the plurality of heat sinks surround a processor mounted on an adapter board which connects directly into a slot of a computer motherboard (i.e., Slot 1 or Slot A). At least two heat sinks, employed in a spaced and parallel relationship, are thermally coupled by either an additional heat sink, a thin metal plate or a flat heat pipe mounted on top of the at least two parallel positioned heat sinks. A plurality of independently powered fans (primary active cooling elements) are mounted on outer surfaces of the heat sinks. A plurality of hairpin or hitch-pin style spring clips are used to hold the at least two heat sinks together and provide a means for changing the spacing therebetween, thereby permitting the present invention to be used with a multitude of different processors. Additional or secondary active cooling elements, such as Peltier Effect modules, are used in alternate embodiments and can be positioned on outer edges of the device (i.e., not laid directly over the die of the processor) to provide additional cooling for the processor. Alternate embodiments of the present invention permit it to be used with a main board socketed processor or other solid state device wherein a thermal transfer column is employed to transfer heat from the socketed device upwardly for dissipation by the device of the present invention.

BRIEF DESCRIPTION OF DRAWINGS

The invention may be best understood by those having ordinary skill in the art by reference to the following detailed description when considered in conjunction with the accompanying drawings in which:

FIG. 1 is a perspective view of a prior art cooling system for a computer CPU;

BEST MODE FOR CARRYING OUT THE INVENTION

Figure 2:
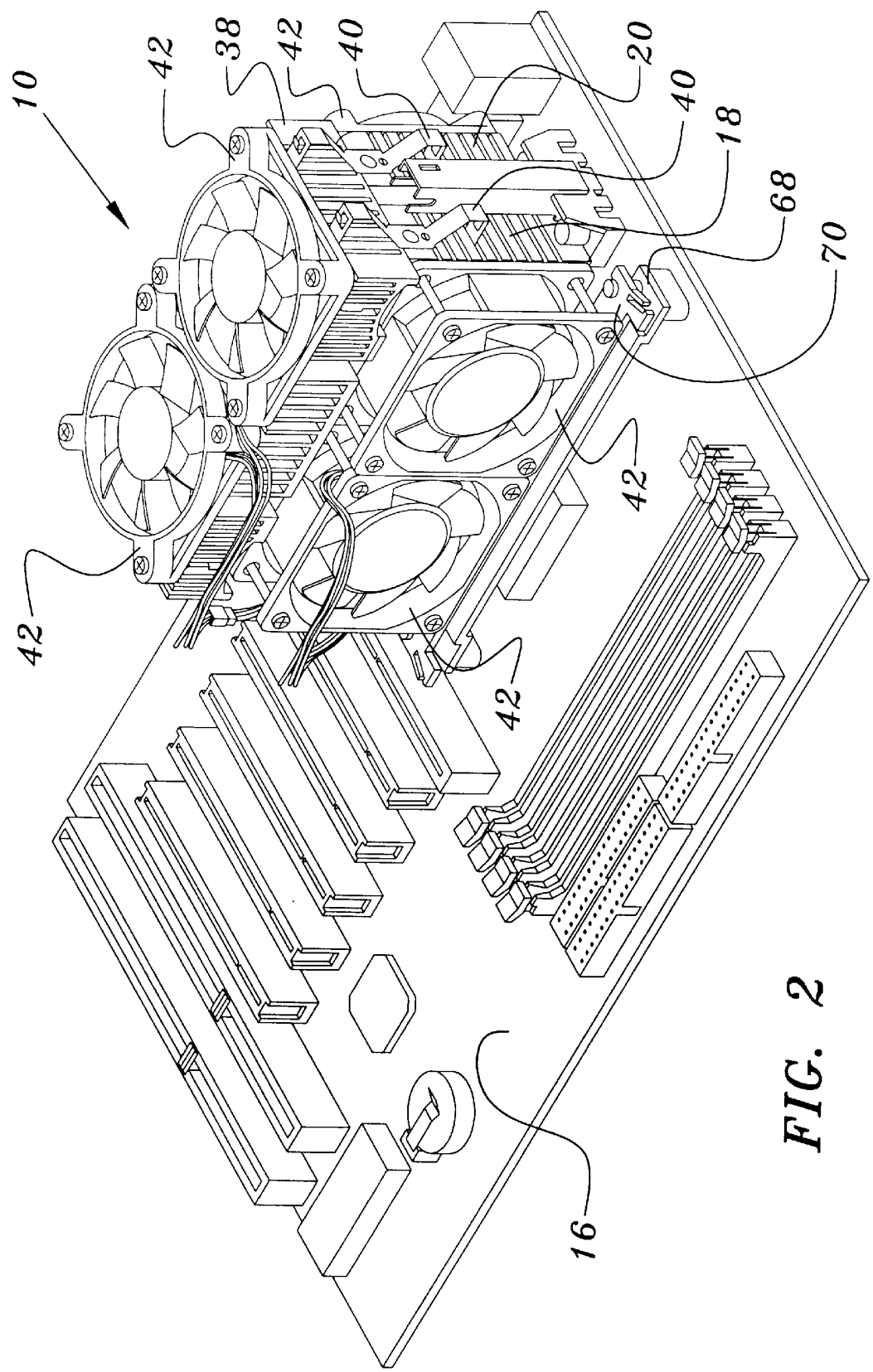
FIG. 2 is a perspective view of the preferred embodiment of the solid state device cooling system of the present invention installed on a computer mother board in a Slot 1 configuration.

Throughout the following detailed description, the same reference numerals refer to the same elements in all figures.

Figure 3:
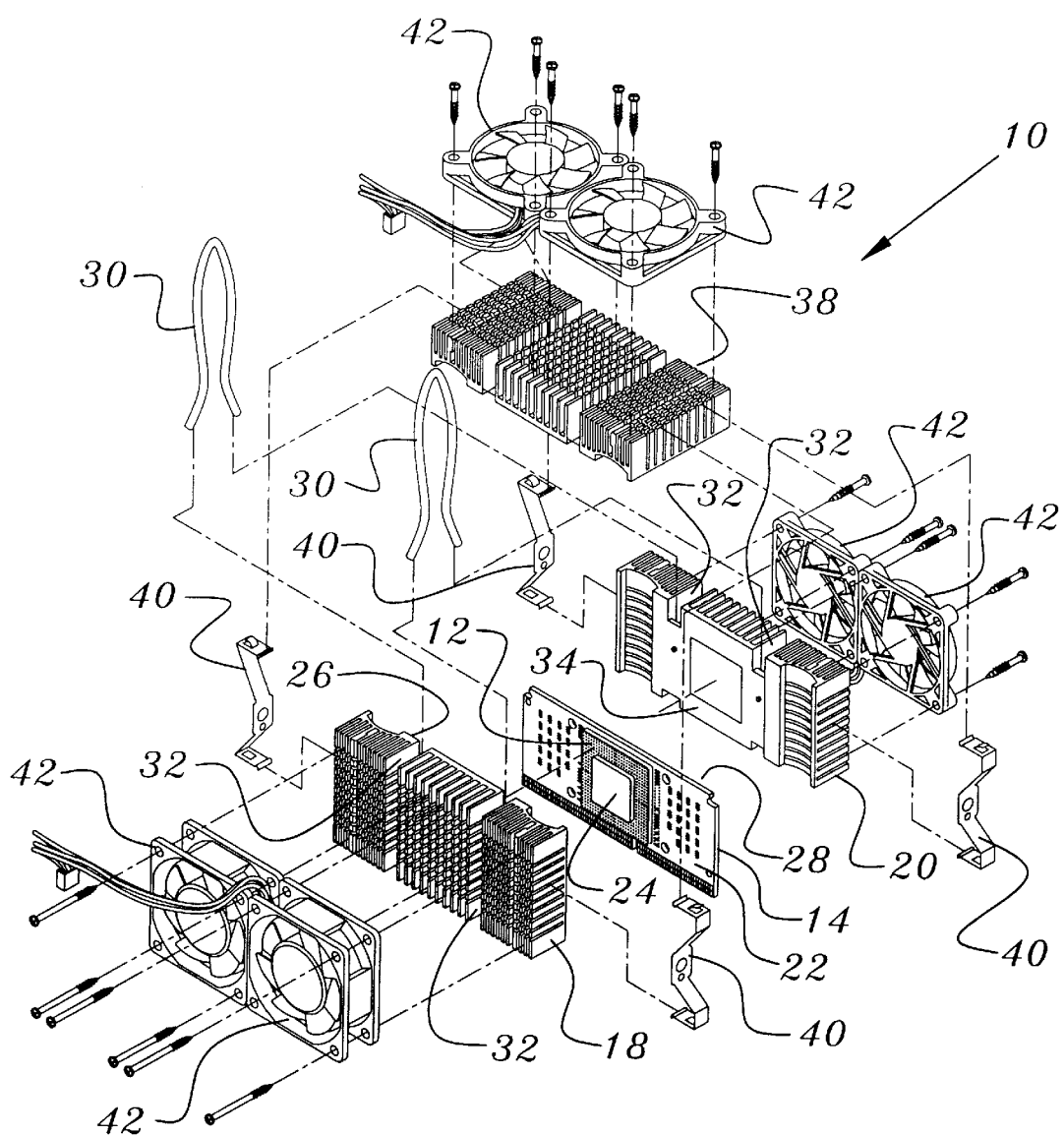
FIG. 3 is an exploded view of the preferred embodiment of the device of the present invention.

Referring to FIGS. 2 and 3, a preferred embodiment of the present invention is shown. In particular, FIGS. 2 and 3 show a thermally-bridged heat dissipation device 10 for surrounding a computer CPU. As shown in FIG. 3 (an exploded view), device 10 surrounds a processor 12 (the computer CPU) mounted on either a daughter board 14 or bridge adapter (not shown). It is important to understand that daughter board configurations are essentially identical to bridge adapter configurations, wherein and the use of either is dictated by the type of processor employed. Both daughter boards and bridge adapters are configured to insert within a slot on a main or motherboard 16. Examples of such slots include those known as Slot 1 and Slot A. Examples of processors that use a daughter board for inserting within a motherboard Slot 1 include, but are not limited to, the Intel Celeron, Pentium-II and Pentium-III family. An example of a processor that uses a bridge adapter for inserting within a motherboard Slot 1 includes, but is not limited to, the Intel Socket 370 family. Further, processors sold under the AMD, Cyrix, Rise and Motorola brand names also mount to a daughter board for inserting within Slot A (not shown) of motherboard 14 (Slot A and Slot 1 being essentially identical except for the number and placement of the pin connections). All of the above listed examples of processors, and others not mentioned herein, can be used with device 10 of the present invention, even though each family of processors requires different spacing requirements for surrounding the processor. Hence, device 10 can be universally employed with all processors which mount to either a daughter board or bridge adapter configuration.

Referring to FIG. 3, device 10 includes a primary and secondary heat sink 18 and 20, respectively. Extrusion type heat sinks represent the preferred choice of passive cooling elements to be used with the present invention, although other types of heat dissipating passive cooling elements could be employed, such as, for example, folded fin heat sinks, heat pipes and heat exchangers. In FIG. 3, processor 12 is a Celeron processor and is being depicted for illustration purposes only, since a plurality of processors, as discussed above, can be used with device 10. Primary heat sink 18 is positioned on a front side 22 of daughter board 14 such that a back side 26 of primary heat sink 18 mates with the die 24 of processor 12. A thin layer of thermal transfer compound such as thermal paste, grease or cement or a piece of thermal tape is intermediately positioned between die 24 and primary heat sink back side 26 to improve the heat transfer from processor 12 to primary heat sink 18. Secondary heat sink 20 has a back side 34 which mates with a back side 28 of daughter board 14 such that primary and secondary heat sink 18 and 20 are in a spaced and parallel relationship surrounding processor 12 on either daughter board 14 or a bridge adapter (which ever is applicable).

Figure 4:
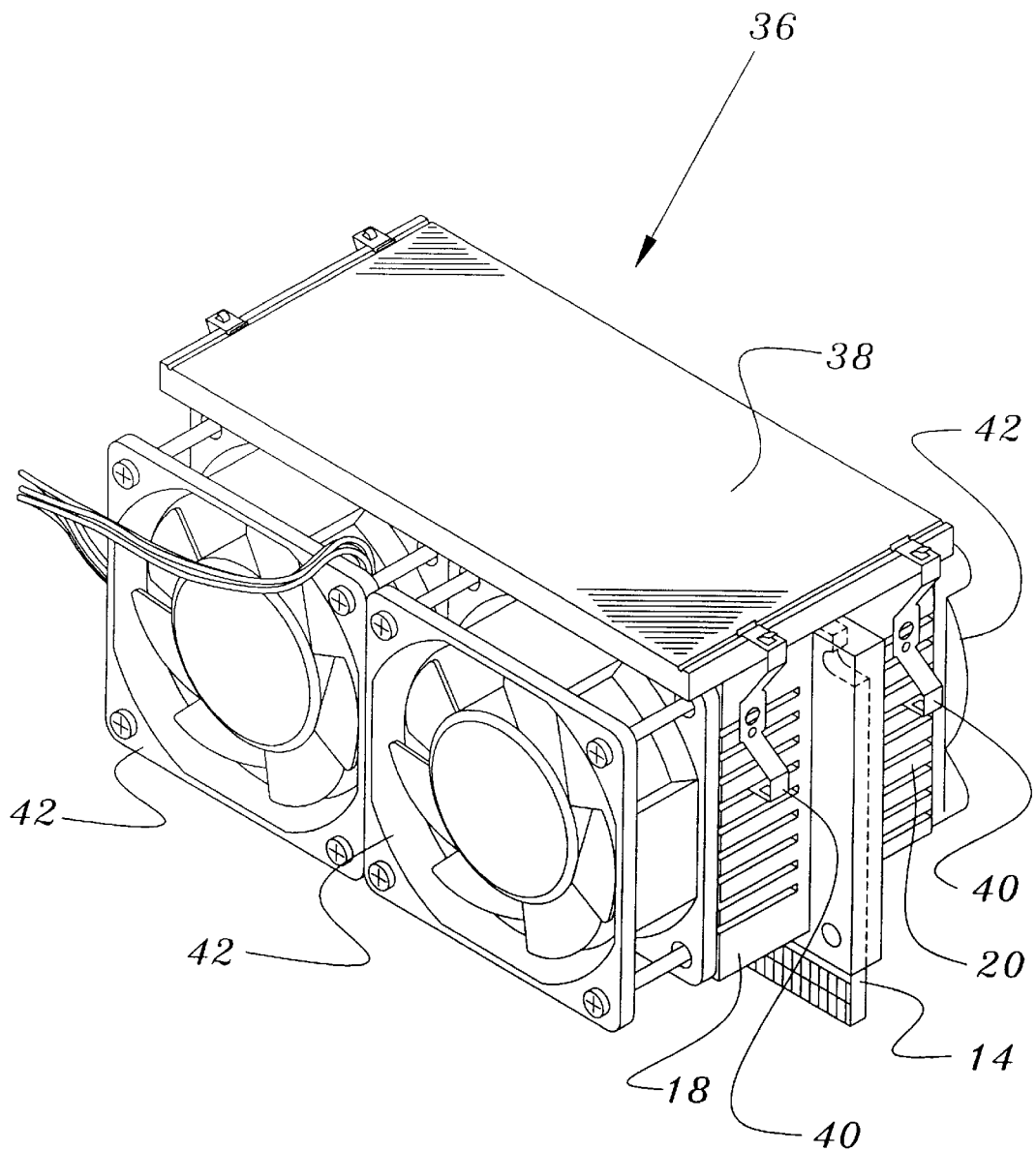
FIG. 4 is a perspective view of a first alternate embodiment of the device of the present invention.

As shown in FIG. 3, a pair of hairpin or hitch-pin style spring clips 30 are used to hold primary and secondary heat sinks 18 and 20 together and for sandwiching processor 12 (and daughter board 14 or an appropriate bridge adapter) therebetween. Clips 30 insert within channels 32 formed in primary and secondary heat sinks 18 and 20. Depending on the processor employed, and therefor the space needed between primary heat sink back side 26 and secondary heat sink back side 34, clips 30 of varying size and width are employed to hold heat sinks 18 and 20 together. As an example, FIG. 4 depicts device 10 surrounding a plastic encased processor (such as the Pentium-II or Pentium-III family processor), whereas FIGS. 2 and 3 depict device 10 surrounding a "bare" processor mounted on daughter board 14. Accordingly, the space needed for the configuration of FIG. 4 is greater than the spaced needed for the configurations of FIGS. 2 and 3. This ability to universally mount to almost every known processor is a great advancement over the prior art. Cooling apparatus and systems of the prior art are almost all product specific (i.e., a cooling system for a Celeron processor will not attach to a Pentium-II, Pentium-III or AMD processor). Referring to FIG. 1, a typical prior art cooling device is shown. This prior art device 1 will not work with the plastic encased processors of the Pentium-II and Pentium-III family.

As noted above, the present invention, in its preferred embodiment, is employed in computer CPUs. But, the present invention can be used with any solid state device which requires cooling so long as it is mounted on a circuit board having similar construction as that of daughter board 14 or that of a main board socketed device (to be discussed in further detail hereinafter). Examples of other solid state devices include, but are not limited to, power amplifier modules for audio frequency and radio frequency devices, robotic or automated machine motor servo amplifier systems, variable frequency motor drives, solid state relays and IGBT (insulated-gate bipolar transistor) modules. Applicant is not aware of any prior art cooling apparatus or system which can be used with both computer CPUs and other heat generating solid state devices wherein the only consideration for employment of the device is a change in the spacing between at least two passive cooling elements.

With continuing reference to FIGS. 2 and 3 (the preferred embodiment), a thermal bridge 38 is provided for thermally coupling primary and secondary heat sinks 18 and 20. As shown therein, thermal bridge 38 is also a passive heat dissipation device, such as a heat sink. As such, thermal bridge 38 provides a third side of heat dissipation to the single heat generating device (processor 12). In essence, the practical application of this novel invention, and that which represents the preferred embodiment, is to provide a heat dissipation device which acts as a heat sink three times larger than all existing designs in the prior art, and one which can be "folded" around processor 12 or any other heat generating solid state device to be cooled. This ability to thermally couple a primary heat dissipator (heat sink 18) to a secondary heat dissipator (heat sink 20) increases the overall performance of the entire device 10 proportional to the increase in radiating area of the thermal dissipator (the heat sinks). Since, as explained above, 90% of the heat generated on a typical computer CPU is radiated from a front side of the processor (at the die), device 10 can now dissipate a greater majority of the radiated heat through the entire device by moving the heat from primary heat sink 18 through thermal bridge 38 into secondary heat sink 20. Whereas prior art devices require up to 90% of the heat generated to be removed by a single front side heat sink, device 10 permits far lesser percentages to be dissipated at the front side heat sink. Device 10 dissipates generally equal percentages of heat at each of the heat sinks employed. In the preferred embodiment, wherein thermal bridge 38 is also a heat sink, one-third of the total heat generated by processor 12 is dispersed and dissipated at each of the three heat sinks employed. In an alternate embodiment (to be discussed directly hereinafter), wherein two heat sinks are employed, thermally coupled by a metal plate, one-half of the heat generated is dispersed and dissipated by each of the two heat sinks employed. Reducing the heat dissipation requirements of the front side heat sink dramatically increases the performance and life of processor 12 or other heat generating solid state device to be cooled. In this preferred embodiment, the thermal bridge 38 (the third heat sink) could further include a pair of flat metal pieces (not shown) positioned on either end of the thermal bridge 38 spaced from one another along a bottom side of thermal bridge 38. A set of fans 42 would then be positioned on a top side of thermal bridge 38. The pair of metal pieces can attach by screws, rivets, clamps or bonding and provides further mechanical and thermal communication between thermal bridge 38, primary heat sink 18 and secondary heat sink 20.

Referring to FIG. 2, a mechanical stability element is provided in the form of a heat sink brace 68. Primary heat sink 18 extends outward from processor 12 and rests upon a top surface 70 of brace 68 and ensures that stress incurred upon device 10, due to the mass thereof, is distributed more evenly.

Referring to FIG. 4, a first alternate embodiment of the present invention is shown and designated by the numeral 36. Device 36 employs a pair of passive cooling elements (heat sinks 18 and 20) which are coupled by thermal bridge 38. In this first alternate embodiment, thermal bridge 38 is a flat metal plate, made from a material having good thermal properties, such as, for example, aluminum, copper, brass or steel. The preferred material is aluminum. The thickness of the metal plate is ideally equal to or greater than the thickness of the base substrate of primary and secondary heat sinks 18 and 20. The metal plate transfers heat gathered by heat sink 18, located on the front side of processor 12, to heat sink 20, located on the back side of processor 12. As noted above, the total heat generated by processor 12 is dissipated approximately in equal amounts (50% by each heat sink). In this first alternate embodiment, the metal plate could also be substituted with a flat heat pipe.

In the first alternate embodiment of FIG. 4, as well as the preferred embodiment of FIGS. 2 and 3, thermal bridge 38 can be mechanically coupled to primary and secondary heat sinks 18 and 20 in a plurality of different manners. Examples of coupling include the use of screws, rivets, clamps or bonding. As shown in FIGS. 2, 3 and 4, the preferred means of coupling is four clamps 40. It is also noted that a thin layer of thermal transfer compound such as thermal paste, grease or cement or a piece of thermal tape should be deployed between thermal bridge 38 and the surface to which it contacts primary and secondary heat sinks 18 and 20 to ensure proper heat transfer.

In addition to passive cooling elements, at least one active cooling element is employed with the present invention . Types of active cooling elements include, but are not limited to, electric fans, Peltier Effect modules, and electrical heat pumps. As shown in the preferred embodiment of FIGS. 2 and 3, six fans 42 are employed for the active cooling element. Each fan 42 is independently powered and receives 12v from a DC power supply (not shown). This ensures that upon failure of any given fan, or even more than one fan, redundancy for the active cooling element of the device is provided. In fact, due to the novel use of thermal bridge 38, all but one fan could fail and the device of the present invention would still retain enough active cooling to ensure a proper operating temperature for processor 12 or other solid state device being cooled. Accordingly, alternate embodiments of the present invention could employ a single fan and still provide adequate active cooling. Since there is not a requirement that six fans be employed, a user of the device of the present invention retains a great amount of flexibility. Since, as explained before, space is limited in today's small business and personal computers, eliminating a particular fan or set of fans to ensure proper spacing of the device will not render it ineffective. Further, larger fans can potentially be employed since their placement on the front side of processor 12 is no longer critical. If a particular high profile fan can not be located on the front side of processor 12, due to limited space, the high profile fan can be located on top of thermal bridge 38 or on secondary heat sink 20. Spacing is almost always limited, and therefore critical, in dual processor configurations and represents an ideal situation where the novel device of the present invention can be employed to effectively dissipate the heat generated by the pair of processors. In such situations, for example, the larger high profile fans, and heat sinks for that matter, can be positioned on opposed sides of the pair of processors to eliminate the possibility of the active and passive cooling elements touching or otherwise interfering with each other. Fans 42 can be attached to heat sinks 18 and 20 in variety of manners, such as, for example, through the use of screws (the preferred manner—see FIGS. 2–7), rivets, clamps, clips, adhesives or double-sided tape.

Figure 5:
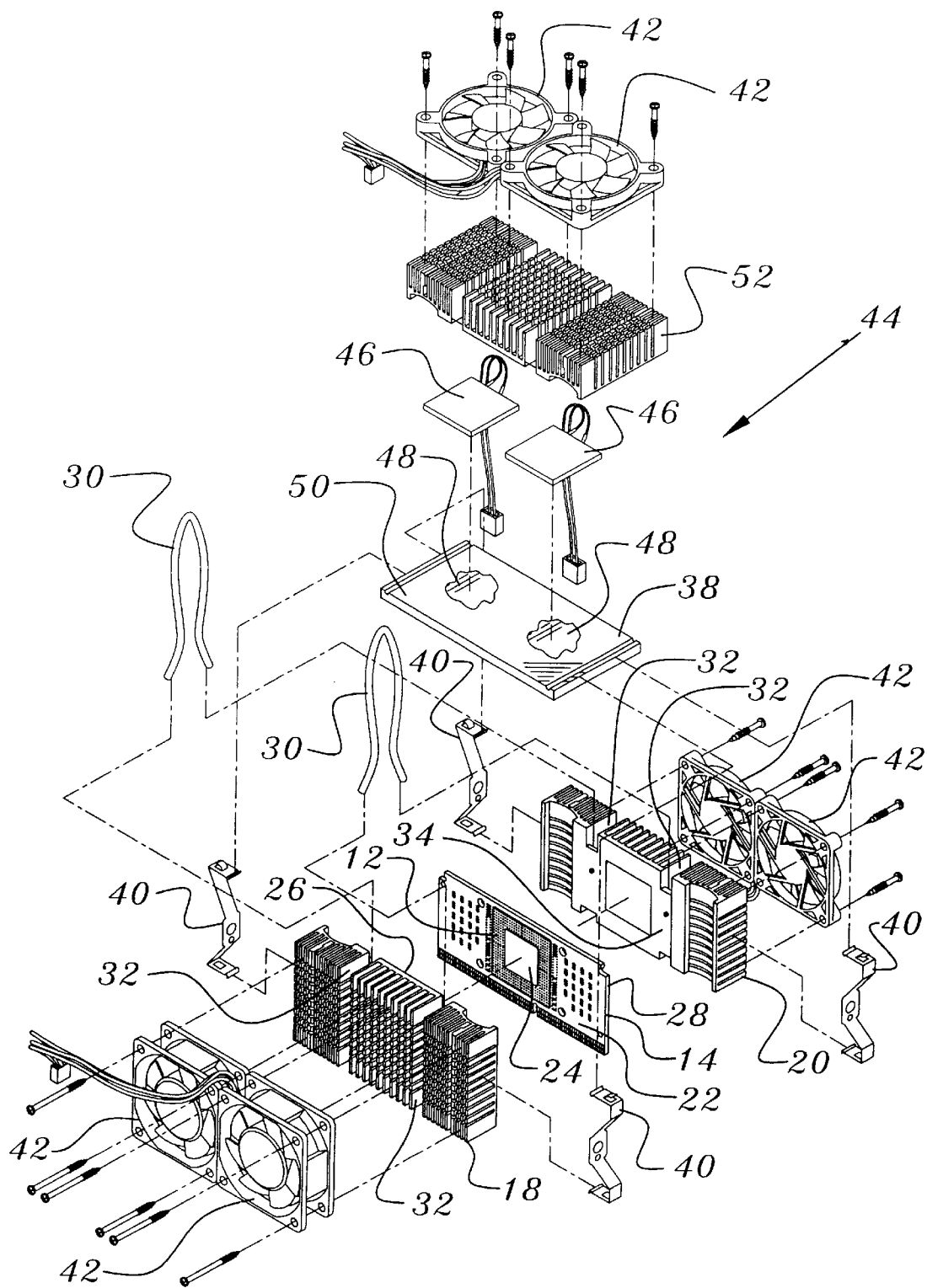
FIG. 5 is an exploded view of a second alternate embodiment of the device of the present invention.

Referring to FIG. 5, a second alternate embodiment is disclosed where the novel device of the present invention is represented by the numeral 44. Device 44 is a hybrid of preferred device 10 and first alternate device 36 with an additional active cooling element. In particular, second alternate device 44 includes thermal bridge 38 employed in the form of a metal plate. Further, a third heat sink 52 is deployed on top of the metal plate. Inserted therebetween is the additional active cooling element—namely, a pair of Peltier Effect modules 46. A thin layer of thermal transfer compound 48, such as thermal paste, grease or cement or a piece of thermal tape, is positioned between the bottom plates of each Peltier Effect module 46 and a top surface 50 of the metal plate. Finally, a pair of fans 42 can be attached on top of the third heat sink 52.

Figure 6:
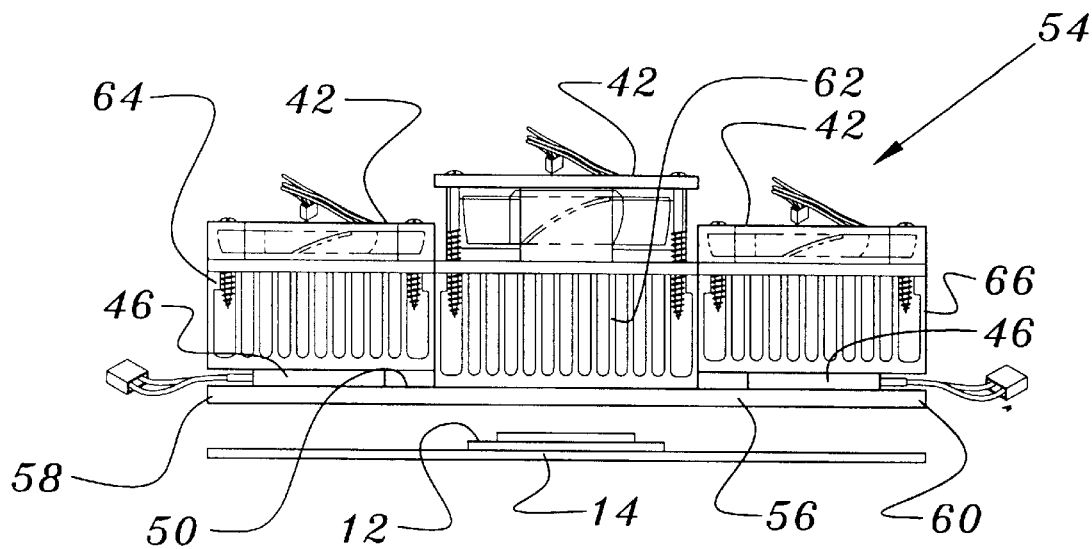
FIG. 6 is a side elevational view of a third alternate embodiment of the present invention illustrating one portion of the cooling device.
Figure 7:
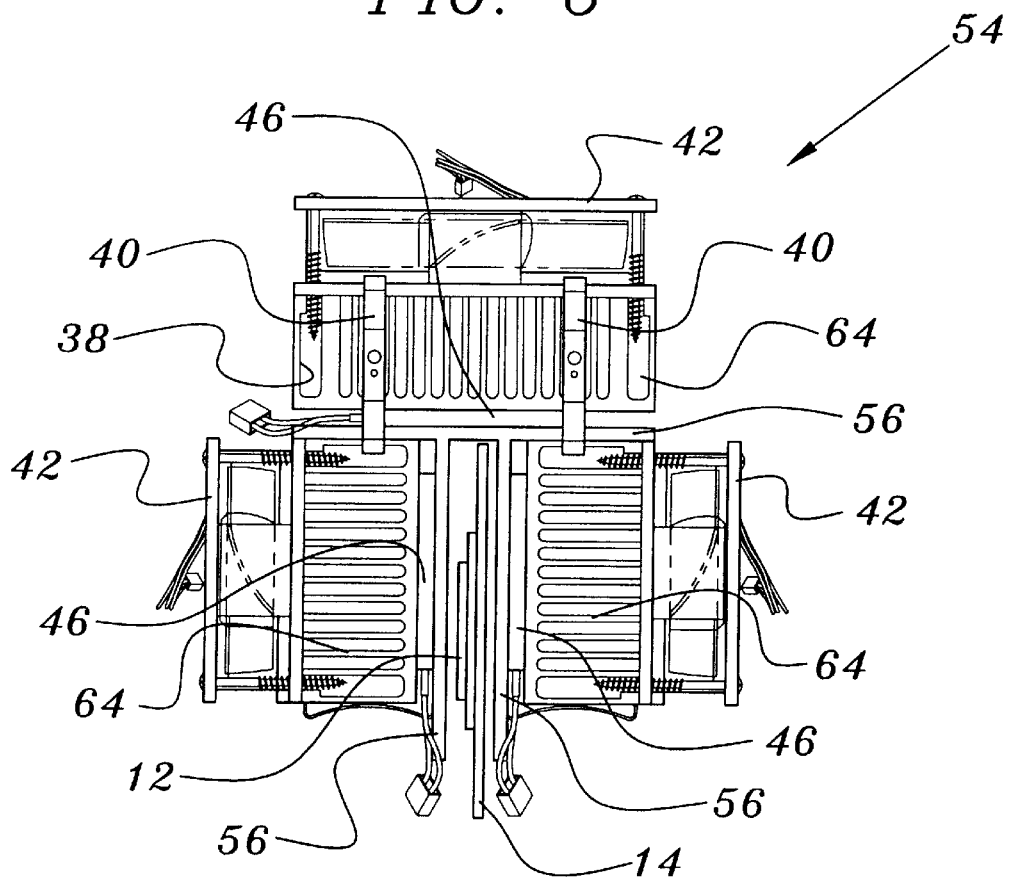
FIG. 7 is a side elevational view of the third alternate embodiment illustrating the entire cooling device.

Referring to FIG. 6, a third alternate embodiment of the present invention is shown and represented by the numeral 54. FIG. 6 is a side elevational view depicting how third alternate device 54 deploys the various active and passive cooling elements. It is understood that FIG. 6 merely depicts the primary passive cooling element (a set of three heat sinks) and the associated active cooling elements. Device 54 additionally employs, as shown in FIG. 7, a secondary passive cooling element (another set of three heat sinks) and the associated active cooling elements and thermal bridge 38 (yet another set of three heat sinks). Varying embodiments of the third alternate embodiment include changes to thermal bridge 38 wherein thermal bridge 38 can be (1) a metal plate; (2) a heat sink and set of fans; or (3) a metal plate, a heat sink, a set of fans and a pair of Peltier Effect modules inserted between the metal plate and heat sink.

As shown in FIG. 6, processor 12 mates with a metal plate 56 which has good thermal properties. A pair of Peltier Effect modules 46 are in turn placed on top surface 50 of metal plate 56 at opposed edges 58 and 60. A set of three heat sinks are in turn stacked on top of the pair of Peltier Effect modules 46 such that a first middle heat sink 62 inserts between the pair of Peltier Effect modules 46 in direct thermal contact with metal plate top surface 50. A second and third heat sink 64 and 66, respectively, are in direct thermal contact with the pair of Peltier Effect modules 46. Finally, a set of three fans 42 are attached to the three heat sinks 62, 64 and 66 along outer surfaces. This novel placement of the Peltier Effect modules, such that they are employed at opposed sides of processor 12, ensures that (1) upon failure of either or both modules, neither will act as insulators thereby redirecting any heat back upon processor 12 and (2) neither module will "sub-cool", processor 12 thereby depositing condensation on die 24 of processor 12. Nowhere in the prior art is it disclosed, taught or suggested to place Peltier Effect modules off axis of die 24 of processor 12.

Referring to FIG. 7, the third alternate embodiment 54 can be seen in its complete form. The set of heat sinks located at the top portion of device 54 represents thermal bridge 38. Although not seen from this view, a plurality of hairpin or hitch-pin style clips 30, identical to those used in the preferred, first and second alternate embodiments, are employed to hold the primary and secondary passive cooling elements (the pair of heat sink sets in the spaced parallel relationship) together. A plurality of clamps 40 are used to hold the primary and secondary cooling elements to thermal bridge 38. And, as in the previous described embodiments, a thin layer of thermal transfer compound 48 such as thermal paste, grease or cement or a piece of thermal tape should be deployed between the heat sinks and the metal plates, the Peltier Effect Modules and the metal plates, the Peltier Effect modules and the heat sinks and the die of the processor and the metal plate to which it contacts.

Figure 8:
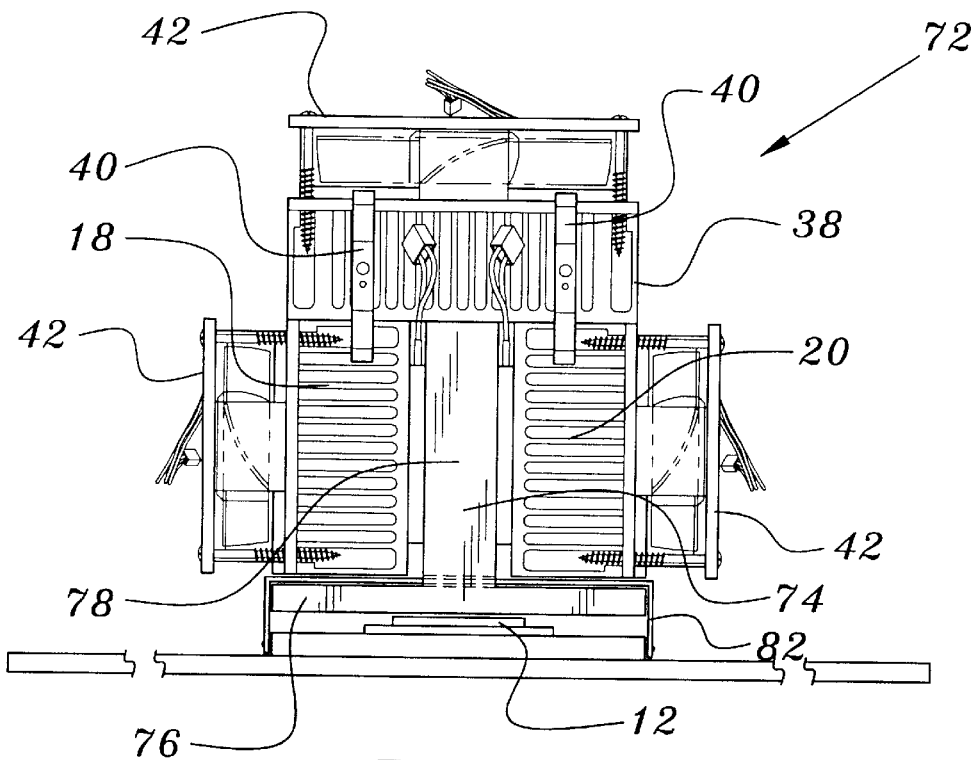
FIG. 8 is a side elevational view of a fourth alternate embodiment of the present invention illustrating use of the device with a socketed processor.
Figures 9, 10:
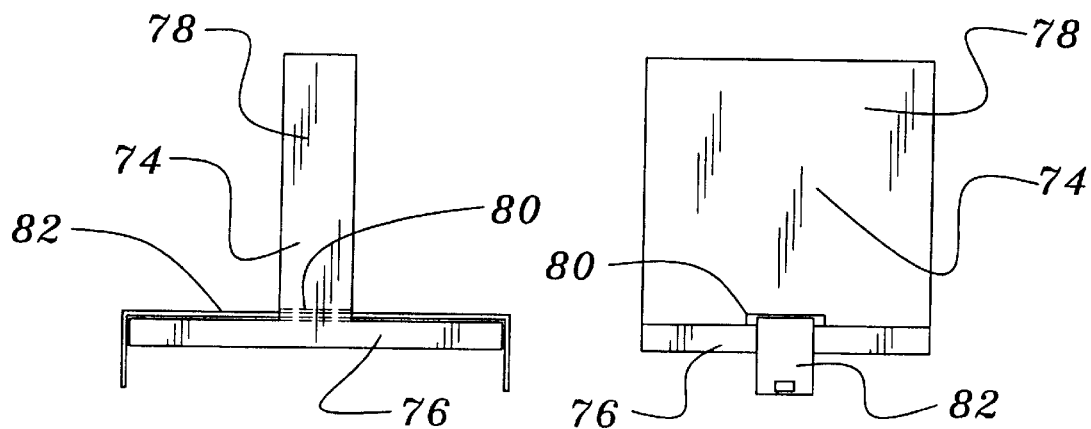
FIG. 9 is a side elevational view of a thermal transfer column used in the fourth alternate embodiment of FIG. 8.
FIG. 10 is a front view of the thermal transfer column of FIG. 9.
Figure 11:
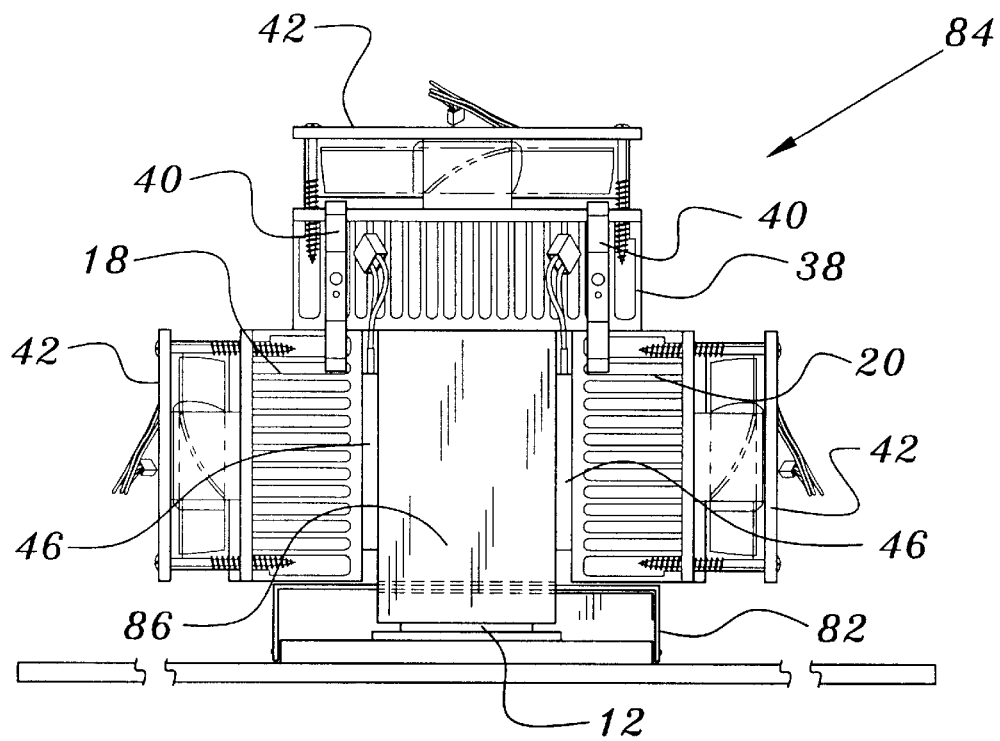
FIG. 11 is a side elevational view of a fifth alternate embodiment of the present invention illustrating use of the device with a socketed processor.
Figures 12, 13:
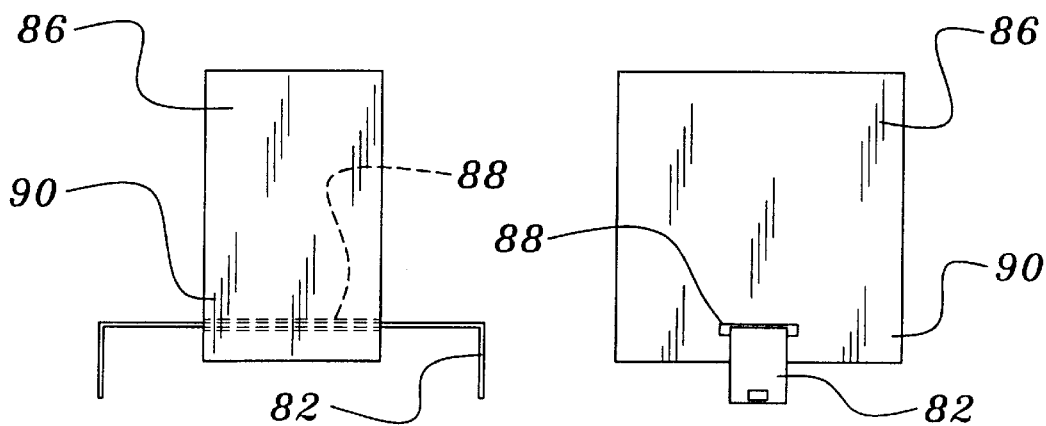
FIG. 12 is a side elevational view of a thermal transfer block used in the fifth alternate embodiment of FIG. 11.
FIG. 13 is a front view of the thermal transfer block of FIG. 12.

Referring to FIG. 8, a fourth alternate embodiment is shown and is represented by the numeral 72. Device 72 is similar to that of the preferred device 10 but works to dissipate heat from a socketed solid state device instead of one mounted on an adapter board. In its preferred form, device 72 is used with a socketed processor 12, such as one mounted in a computer Socket 7 or Socket 370 configuration and that which is depicted in FIG. 8. However, device 72 could be employed with other main board socketed devices including, but not limited to, power amplifier modules for audio frequency and radio frequency devices, robotic or automated machine motor servo amplifier systems, variable frequency motor drives, solid state relays and IGBT modules. Device 72 employs a thermal transfer column 74 which sits directly upon main board socketed processor 12. In this fourth alternate embodiment, thermal transfer column 74 has an inverted t-shaped including a horizontal and vertical member 76 and 78, respectively. A channel 80, as seen in FIGS. 9 and 10, is formed through vertical member 78 along a bottom portion directly above horizontal member 76 permitting a c-shaped spring clip 82 to insert therethrough, thereby holding thermal transfer column 74 down against processor 12 and the main board to which processor 12 is socketed. Alternate means of attaching thermal transfer column 74 include the use screws, rivets, thermal cement and double-sided tape. Vertical member 78 extends upwardly from the main board to which processor 12 is socketed. Primary and secondary heats sinks 18 and 20 surround vertical member 78 of thermal transfer column 74 in a manner similar to that of the preferred device 10 surrounding processor 12 mounted on an adapter board. Thermal bridge 38 is mounted along a top end of primary and secondary heat sinks 18 and 20. In its preferred form, device 72 employs a heat sink for thermal bridge 38, although a metal plate or flat heat pipe could be employed as a substitute therefor. Referring to FIG. 8, Peltier Effect modules 46 can be inserted between primary and secondary heat sinks 18 and 20 and vertical member 78 of thermal transfer column 74. Although not shown, a third Peltier Effect module could also be inserted between thermal bridge 38 and the top end of primary and secondary heat sinks 18 and 20. Any suitable material having good thermal transfer properties could be employed for thermal transfer column, including, but not limited to, aluminum, copper, brass or steel—the preferred material being aluminum. Further, thermal transfer column 74 can be either a solid block of metal or a hollow extrusion with a closed end. Referring to FIG. 11, a fifth alternate embodiment is shown and is represented by the numeral 84. Device 84 is similar to that of the fourth alternate device 72 which works to dissipate heat generated by a socketed solid state device. In its preferred form, device 84 is used with a socketed processor 12, such as one mounted in a computer Socket 7 or Socket 370 configuration and that which is depicted in FIG. 11. However, device 84 could be employed with other main board socketed devices including, but not limited to, power amplifier modules for audio frequency and radio frequency devices, robotic or automated machine motor servo amplifier systems, variable frequency motor drives, solid state relays and IGBT modules. Device 84 employs a thermal transfer block 86 which sits directly upon main board socketed processor 12. In this fifth alternate embodiment, thermal transfer block 86 is rectangular in shape. A channel 88, as seen in FIGS. 12 and 13, is formed through a bottom portion 90 permitting a c-shaped spring clip 82 to insert therethrough and hold thermal transfer block 86 down against processor 12 and the main board to which processor 12 is socketed. Thermal transfer block 86 extends upwardly from the main board to which processor 12 is socketed. Primary and secondary heats sinks 18 and 20 surround thermal transfer block 86 in a manner similar to that of the fourth alternate device 72 surrounding vertical member 78 of thermal transfer column 74. Thermal bridge 38 is mounted along a top end of primary and secondary heat sinks 18 and 20. In its preferred form, device 84 employs a heat sink for thermal bridge 38, although a metal plate or flat heat pipe could be employed as a substitute therefor. Referring to FIG. 11, Peltier Effect modules 46 can be inserted between primary and secondary heat sinks 18 and 20 and thermal transfer block 86. Although not shown, a third Peltier Effect module could also be inserted between thermal bridge 38 and the top end of primary and secondary heat sinks 18 and 20. Any suitable material having good thermal transfer properties could be employed for thermal transfer block 86, including, but not limited to, aluminum, copper, brass or steel—the preferred material being aluminum. Further, thermal transfer block 86 can be either a solid block of metal or a hollow extrusion with a closed end. In both the fourth and fifth alternate embodiments, a proprietarily designed heat pipe could be substituted for thermal transfer column 74 or thermal transfer block 86 for improved thermal transfer efficiency from processor 12 (or other solid state device) to the thermally bridged heat sink assembly.

In all of the aforementioned embodiments, EM or RF radiation can be eliminated or reduced to a non-critical level by attaching a ground wire (not shown) to one of the heat sinks. Since processor 12 is surrounded by the metal of heat sinks 18 and 20 and thermal bridge 38, the grounding of these units will help shunt or drain EM and RF energy to ground.

Further to all of the aforementioned embodiments, temperature monitoring of processor 12 can be provided. In accordance therewith, a thermal sensor (not shown) can be mounted to the thermally-bridged heat dissipation device and coupled to either the thermal header of motherboard 16 or to an auxiliary temperature monitoring device (i.e., LCD or LED display module). The preferred thermal sensor is a 10K ohm @ 25 degree Celsius thermistor.

Still further to all of the aforementioned embodiments, the preferred heat sink for primary and secondary heat sink 18 and 20 is made of aluminum and has a plurality of radiating surfaces and includes extruded fin, pin fin, folded/corrugated fin or bonded fin type heat sinks. When a heat sink is employed for thermal bridge 38, the preferred style of heat sink should be a finned or pin finned style heat sink, such as model VEK 12 manufactured by Globalwin Ltd. of Taiwan.

Equivalent elements can be substituted for the ones set forth above herein such that they perform the same function in the same way for achieving the same result.

Having thus described the invention what is claimed and desired to be secured by Letters Patent is:

1. A thermally-coupled heat dissipation apparatus for cooling a solid state electronic device electrically coupled to a first circuit board, the thermally-coupled heat dissipation apparatus comprising:
   a) at least two passive cooling elements, each having a pair of channels formed therein,
   b) a plurality of spring-clips inserted within the pair of channels for positioning the at least two passive cooling elements in a spaced parallel relationship and for surrounding the first circuit board,
   c) a bridge member removable attached to top portions of the at least two passive cooling elements providing a thermally-coupled path therebetween,
   d) at least one active cooling element mounted on an outer surface of one of the at least two passive cooling elements, and
   e) means for attaching the bridge member.

2. The thermally-coupled heat dissipation apparatus of claim 1, wherein the at least two passive cooling elements comprises a primary and secondary heat sink.

3. The thermally-coupled heat dissipation apparatus of claim 2, further comprising:
   a) a slot located on the first circuit board, and
   b) a second circuit board perpendicularly inserted within the first circuit board slot providing an electrical connection therebetween, the solid state electronic device mounted directly to the second circuit board.

4. The thermally-coupled heat dissipation apparatus of claim 3, wherein the solid state electronic device is a computer processor having an exposed die element, the processor mounted on a front side of the second circuit board, the primary heat sink in thermal contact with the processor die element and the secondary heat sink in thermal contact with a back side of the first circuit board.

5. The thermally-coupled heat dissipation apparatus of claim 3, wherein the solid state electronic device is a computer processor mounted on a front side of the second circuit board, the second circuit board enclosed within a housing and having a slot connection portion extending outwardly from an open bottom end of the housing, the primary heat sink in thermal contact with the housing proximal to the front side of the second circuit board, the secondary heat sink in thermal contact with the housing proximal to a back side of the second circuit board, the second circuit board slot connection portion inserting within the first circuit board slot.

6. The thermally-coupled heat dissipation apparatus of claim 1, further comprising a thermal transfer member in thermal contact with the solid state electronic device.

7. The thermally-coupled heat dissipation apparatus of claim 6, wherein the thermal transfer member is chosen from the group consisting of an inverted t-shaped column and a rectangular-shaped block.

8. The thermally-coupled heat dissipation apparatus of claim 7, wherein the solid state electronic device is a computer processor having a top side, the processor mounted in a socket located on the first circuit board, the thermal transfer member set on the processor top side and extending upwardly from the first circuit board, the at least two passive cooling elements surrounding the thermal transfer member.

9. The thermally-coupled heat dissipation apparatus of claim 1, wherein a pair of spring-clips are employed.

10. The thermally-coupled heat dissipation apparatus of claim 1, wherein the bridge member comprises at least one heat sink.

11. The thermally-coupled heat dissipation apparatus of claim 1, wherein the bridge member comprises at least one flat metal plate.

12. The thermally-coupled heat dissipation apparatus of claim 1, wherein the at least one active cooling element comprises at least one electric fan.

13. The thermally-coupled heat dissipation apparatus of claim 2, wherein the means for attaching the bridge member is a plurality of clamps, each having a first and second end, each clamp first end engaging a top surface of the bridge member and each clamp second end engaging side surfaces of the primary and secondary heat sinks.

14. The thermally-coupled heat dissipation apparatus of claim 1, further comprising:
a) the bridge member having a top surface,
b) a pair of Peltier Effect modules mounted on the bridge member top surface, and
c) at least one additional passive cooling element mounted above the Peltier Effect modules.

15. The thermally-coupled heat dissipation apparatus of claim 14, wherein the pair of Peltier Effect modules are mounted at opposed side edges of the bridge member providing a space therebetween.

16. The thermally-coupled heat dissipation apparatus of claim 15, wherein the at least one additional passive cooling element comprises three heat sinks, the first heat sink in thermal contact with the bridge member top surface and positioned between the pair of Peltier Effect modules in the space, the second and third heat sinks in thermal contact with respective top plates of the pair of Peltier Effect modules and surrounding the first heat sink.

17. A thermally-coupled heat dissipation device for cooling a computer CPU mounted on an adapter board, the adapter board having a front and back side and a pin connection portion for inserting within a slot of a computer motherboard, the thermally-coupled heat dissipation device comprising:
a) a primary and secondary heat sink surrounding the adapter board on the front and back side respectively, each heat sink having a pair of channels formed therethrough,
b) a pair of spring-clips inserted within the primary and secondary heat sink channels for positioning the primary and secondary heat sink in a spaced parallel relationship,
c) a bridge member removably attached to top portions of the primary and secondary heat sinks providing a thermally-coupled path therebetween, the bridge member having a top surface,
d) at least one active cooling element mounted on an outer surface of either the primary or secondary heat sink, and
e) means for attaching the bridge member.

18. The thermally-coupled heat dissipation apparatus of claim 17, wherein the computer CPU has an exposed die element located on the adapter board front side in thermal contact with the primary heat sink, the secondary heat sink in thermal contact with the adapter board back side.

19. The thermally-coupled heat dissipation apparatus of claim 17, wherein the adapter board is enclosed within a housing having a front and back side and an open bottom end permitting the pin connection portion to extend outwardly from the housing, the primary heat sink in thermal contact with the housing front side and the secondary heat sink in thermal contact with the housing back side.

20. The thermally-coupled heat dissipation apparatus of claim 17, wherein the bridge member is chosen from the group consisting of at least one heat sink and at least one flat metal plate.

21. The thermally-coupled heat dissipation apparatus of claim 17, wherein the at least one active cooling element comprises at least one electric fan.

22. The thermally-coupled heat dissipation apparatus of claim 17, wherein the means for attaching the bridge member is two pair of clamps, a first pair of clamps attaching the bridge member to opposed sides of the primary heat sink, a second pair of clamps attaching the bridge member to opposed sides of the secondary heat sink, each clamp having a first and second end, each clamp first end engaging the bridge member top surface and each clamp second end engaging a respective side of the primary and secondary heat sinks.

23. The thermally-coupled heat dissipation apparatus of claim 17, further comprising:
a) a pair of Peltier Effect modules mounted on the bridge member top surface, and
b) at least one additional passive cooling element mounted above the Peltier Effect modules.

24. A thermally-coupled heat dissipation apparatus for cooling a computer CPU mounted in a socket located on a computer main board, the CPU having a top side, the thermally-coupled heat dissipation apparatus comprising:
a) a thermal transfer member set on the processor top side and extending upwardly from the computer main board,
b) a primary and secondary heat sink surrounding the thermal transfer member, each heat sink having a pair of channels formed therethrough,
c) a pair of spring-clips inserted within the primary and secondary heat sink channels for positioning the primary and secondary heat sink in a spaced parallel relationship,
d) a bridge member removably attached to top portions of the primary and secondary heat sinks providing a thermally-coupled path therebetween,
e) at least one active cooling element mounted on an outer surface of either the primary or secondary heat sink, and
f) means for attaching the bridge member.

25. The thermally-coupled heat dissipation apparatus of claim 24, wherein the thermal transfer member is chosen from the group consisting of an inverted t-shaped column and a rectangular-shaped block.

26. The thermally-coupled heat dissipation apparatus of claim 24, further comprising a pair of Peltier Effect modules positioned between the primary and secondary heat sinks and the upwardly extending thermal transfer member.

* * * * *